(12) United States Patent
Yang et al.

(10) Patent No.: US 6,277,661 B1
(45) Date of Patent: Aug. 21, 2001

(54) METHOD FOR DETECTING SLOPED CONTACT HOLES USING A CRITICAL-DIMENSION WAVEFORM

(75) Inventors: Jean Yang, Palo Alto; Ian Dudley, Santa Clara; Khoi Phan, San Jose, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/677,955

(22) Filed: Oct. 2, 2000

Related U.S. Application Data

(60) Provisional application No. 60/214,929, filed on Jun. 29, 2000.

(51) Int. Cl.$^7$ ................................................ H01L 21/66
(52) U.S. Cl. .............................................. 438/14; 438/16
(58) Field of Search .................................. 438/14, 15–18, 438/756, 800; 73/865.8; 356/358, 355

(56) References Cited

U.S. PATENT DOCUMENTS 5,969,273 * 10/1999 Archie et al. ...................... 73/865.8

OTHER PUBLICATIONS

Grant, P.W. "Use of Scanning Electron Microscope for Critical Dimension Measurements on a Semiconductor Production line." Proc. of the SPIE (1985) vol. 565, p.169–72. Conf: Micron and Submicron Int. Circ. Metrology. San Diege, CA, USA, 22–23 Aug. 1985.*

* cited by examiner

Primary Examiner—Charles Bowers
Assistant Examiner—Craig Thompson
(74) Attorney, Agent, or Firm—Sawyer Law Group LLP

(57) ABSTRACT

A method for contact hole formation and inspection during integrated circuit fabrication is disclosed. The method includes defining tolerances for one or more contact hole formation processes, and then performing the formation processes to create at least one contact hole. After at least one of the formation processes is performed, a waveform is generated for the contact hole. A critical dimension (CD) and an edge width value are then generated for the contact hole from the waveform. The CD and the edge width value are then compared to the tolerances to detect and correct variations in the formation process. In a further aspect of the present invention, the edge width is compared to a predetermined limit to automatically detect contact holes having sloped sidewalls.

11 Claims, 7 Drawing Sheets

COF

-0.6 μm

+0.6 μm

METHOD FOR DETECTING SLOPED CONTACT HOLES USING A CRITICAL-DIMENSION WAVEFORM

CROSS REFERENCE TO RELATED APPLICATION

This application is claiming under 35 USC 120 the benefit of provisional patent application serial no. 60/214,929 filed on Jun. 29, 2000.

FIELD OF THE INVENTION

The present invention relates to the fabrication of integrated circuits, and more particular to an algorithm for detecting sloped contact holes using a critical dimension waveform.

BACKGROUND OF THE INVENTION

When integrated circuits are fabricated, isolated active-region regions are created and connected through electrical interconnect paths to implement the desired circuit function. Wherever a connection is needed, an opening in the active-region must be provided to allow such contacts to occur. In multilevel-interconnect structures, the contact holes are openings into the active-regions and openings called vias in the intermetal dielectric layers, which allow contacts to be made between adjacent metal layers.

FIG. 1 is a cross-sectional view of a contact hole 10 over an active-region 12. The contact hole has been formed through a layer of glass 14 and a layer of photoresist 16. The process for forming the contact hole 10 begins by covering the active-region 12 with the layer of glass 14 followed by the layer of photoresist 16. The location of the contact hole 10 is patterned by using a stepper device to expose the photoresist 16 through a mask to form the opening in the photoresist 16 at the desired locations. A plasma etcher then etches the glass 14 down to the active-region 12 through the opening in the photoresist 16 to form the contact hole 10. To enable proper contact between the interconnect and the active-region 12, the diameter of the contact hole 10 must be within a certain tolerance, e.g., 0.5 to 0.75 $\mu$m, and the sides of the contact hole 10 should be substantially straight and clear of debris.

During contact hole formation, however, process variations may be encountered that result in malformed contact holes that prevent the interconnects from making proper contact with the device. During deposition of the photoresist 16, for instance, the track system that deposits the photoresist 16 may vary the thickness and concentration of the photoresist 16. When the photoresist 16 is then exposed to light by the stepper device, the varying photoresist thickness may cause improper focusing of the light during the exposure. The stepper's focus may also drift independent of the photoresist.

Regardless of the cause, focus drift causes contact hole diameter to become too large or two small. In addition, an out of focus exposure may create a contact hole that has sloped sidewalls because the exposure failed to clear all the photoresist in the opening down to the glass layer 14. Sloped sidewalls at the bottom of the opening will cause the diameter of the hole etched into the glass to be too small for adequate interconnect contact.

Even with an in focus exposure that forms a proper opening in the photoresist 16, there is no guarantee that the plasma etcher used to etch the glass will result in correct contact hole formation, because the plasma etcher is also subject to variations in power, temperature, and gas flow for example.

Consequently, various types of process drifts encountered during contact hole formation may result in some contact holes being formed with inadequate diameters and/or sidewalls. After contact hole formation, therefore, the contact holes must be inspected. The conventional method for inspecting the contact holes typically involves two steps. The first step is to measure the critical dimension (CD), or diameter, of each contact hole using a top-down scanning electron microscope (SEM) tool, referred to as a CD-SEM. The current CD-SEM tools have integrated pattern recognition capabilities to produce a waveform of the contact hole at a location of interest from which the diameter of the hole can be measured.

FIGS. 2A–2C are diagrams illustrating top views of several contact hole images and corresponding waveforms produced by the CD-SEM. FIG. 2A shows a contact hole printed at a stepper's center of focus (COF). FIG. 2B shows a contact hole printed at –0.6 $\mu$m from the COF, and FIG. 2C shows a contact hole printed +0.6 $\mu$m from the COF. As shown, each waveform is a plot of intensity values of the contact hole image. The light pixels in the image outlining the diameter of the hole generate the highest intensity values, or peaks, on the waveform. The intensity values of the waveform or their derivatives are then analyzed by an algorithm that measures the distance between the two points in the waveform, e.g., the two maximum peaks, to determine the CD of the corresponding contact hole. Traditionally, the algorithm for measuring diameters is chosen based on match-up to final product size and reproducibility, so they are by design insensitive to process variations.

Although such CD measurement is useful for insuring that the contact holes are within diameter tolerance, the CD measurement does not detect the presence of sloped sidewalls, hence the need for the second inspection step. In the second inspection step, the contact holes are manually inspected for sloped sidewalls by viewing into the holes through a scanning electron microscope, which increases both the time and cost of fabrication.

According, what is needed is an improved method for fabricating and inspecting integrated circuit contact holes, and more particularly, an improved method for detecting contact holes having sloped sidewalls, and in the extreme case, uncleared contact holes. The present invention addresses such a need.

SUMMARY OF THE INVENTION

The present invention provides a method and apparatus for contact hole formation and inspection during integrated circuit fabrication. The method includes defining tolerances for one or more contact hole formation processes, and then performing the formation processes to create at least one contact hole. After at least one of the formation processes is performed, a waveform is generated for the contact hole. A critical dimension (CD) and an edge width value are then generated for the contact hole from the waveform. The CD and the edge width value are then compared to the tolerances to detect and correct variations in the formation process. In a further aspect of the present invention, the edge width is compared to a predetermined limit to automatically detect contact holes having sloped sidewalls.

According to the present invention, a single SEM waveform for a contact hole is utilized to detect not only the CD, but also the slope of the sidewalls by calculating the edge width, thereby eliminating the need for manual inspection and reducing manufacturing costs.

DETAILED DESCRIPTION

The present invention relates to the fabrication and inspection of integrated-circuit contact holes. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

The present invention is an improved process for detecting process drifts during contact hole formation. The present invention utilizes a single SEM waveform to detect not only the CD, but also the slope of the sidewalls. In a preferred embodiment of the present invention, sloped sidewalls are detected by calculating the first derivative of the CD-SEM waveform.

Figure 1:
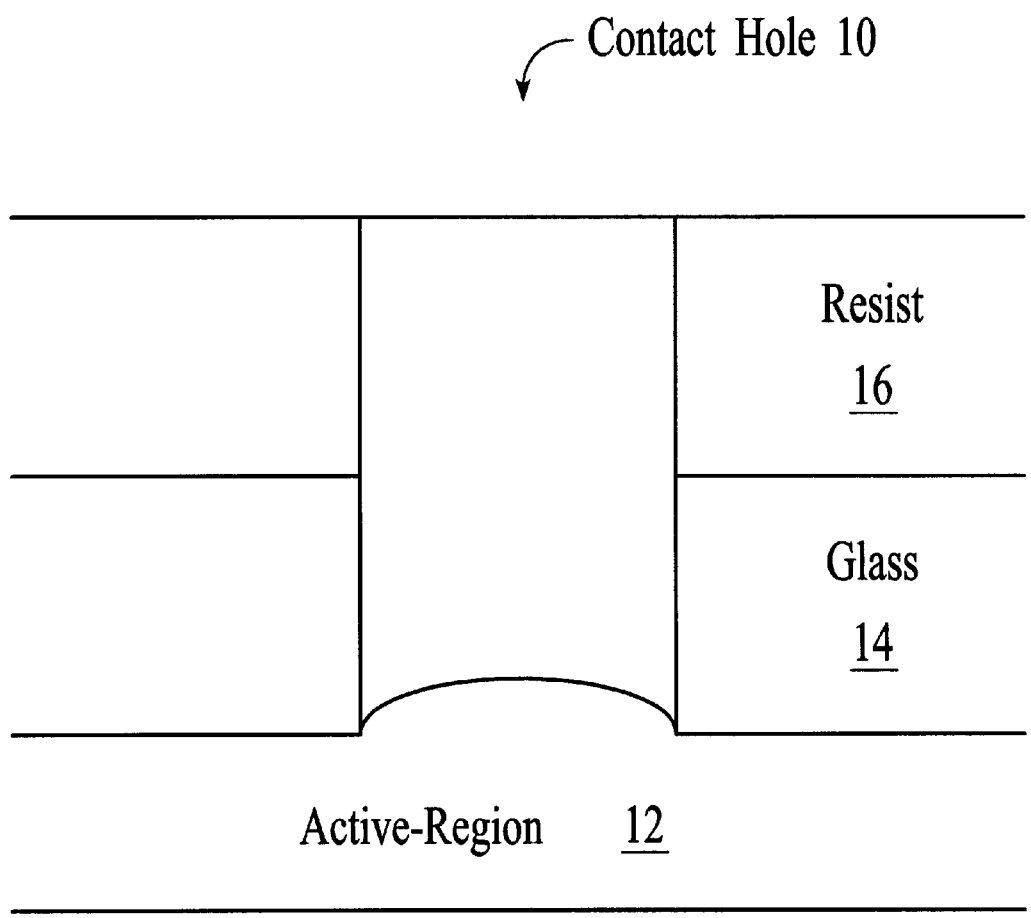
FIG. 1 is a cross-sectional view of a contact hole over an active-region.
Figure 2A:
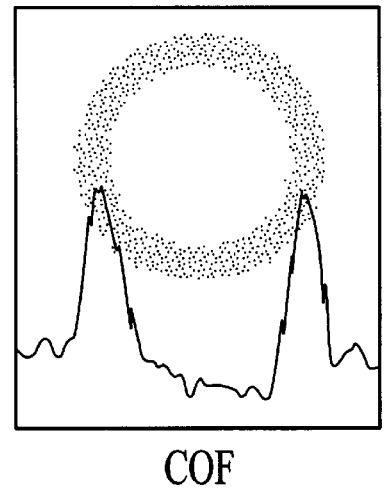
FIGS. 2A–2C are diagrams illustrating top views of several contact hole images and corresponding waveforms produced by a CD-SEM tool.
Figure 2B:
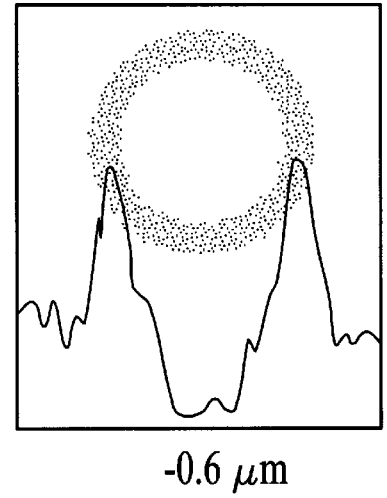
Figure 2C:
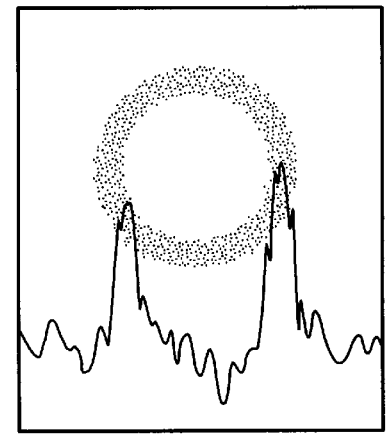
Figure 3:
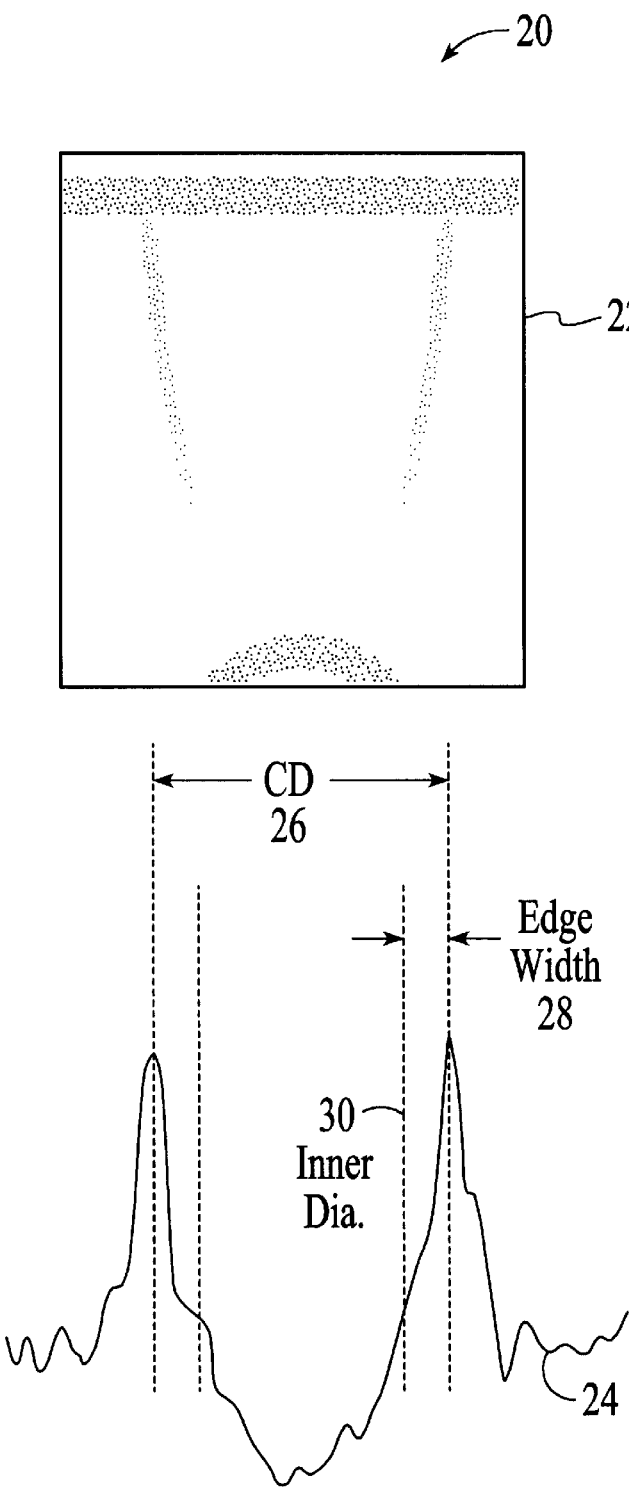
FIG. 3 is a cross-sectional SEM view of a contact hole having sloped sidewalls and a corresponding CD-SEM waveform.

FIG. 3 is a cross-sectional SEM view of a contact hole having sloped sidewalls, and a corresponding CD-SEM waveform. The waveform 24 is similar to the waveforms shown in FIG. 2 for the −0.6 and −0.4 μm focus increments in which the graphs of the waveforms between the peaks are sloped, forming a valley-like shape. Contrasted with the waveform 24 for a sloped contact hole shown in FIG. 3, a waveform for a contact hole having substantially straight sides has an essentially flat graph between peaks, as shown in the COF waveform of FIG. 2A.

The present invention is an algorithm that utilizes a single waveform 24 to calculate both the CD 26 for the contact hole 20 as well as detect the shape of the graph between the peaks of a waveform to determine whether or not the contact hole 20 has sloped sidewalls 22. In a preferred embodiment, the algorithm detects the shape of the graph between the peaks of a waveform by calculating the edge width 28 of the contact hole 20. Referring again to FIG. 3, the edge width 28 is calculated by locating an inner diameter 30 of the contact hole 20. Once variations in the CD 26 and edge width 28 are detected, process drifts may be corrected during contact hole formation.

Figure 4:
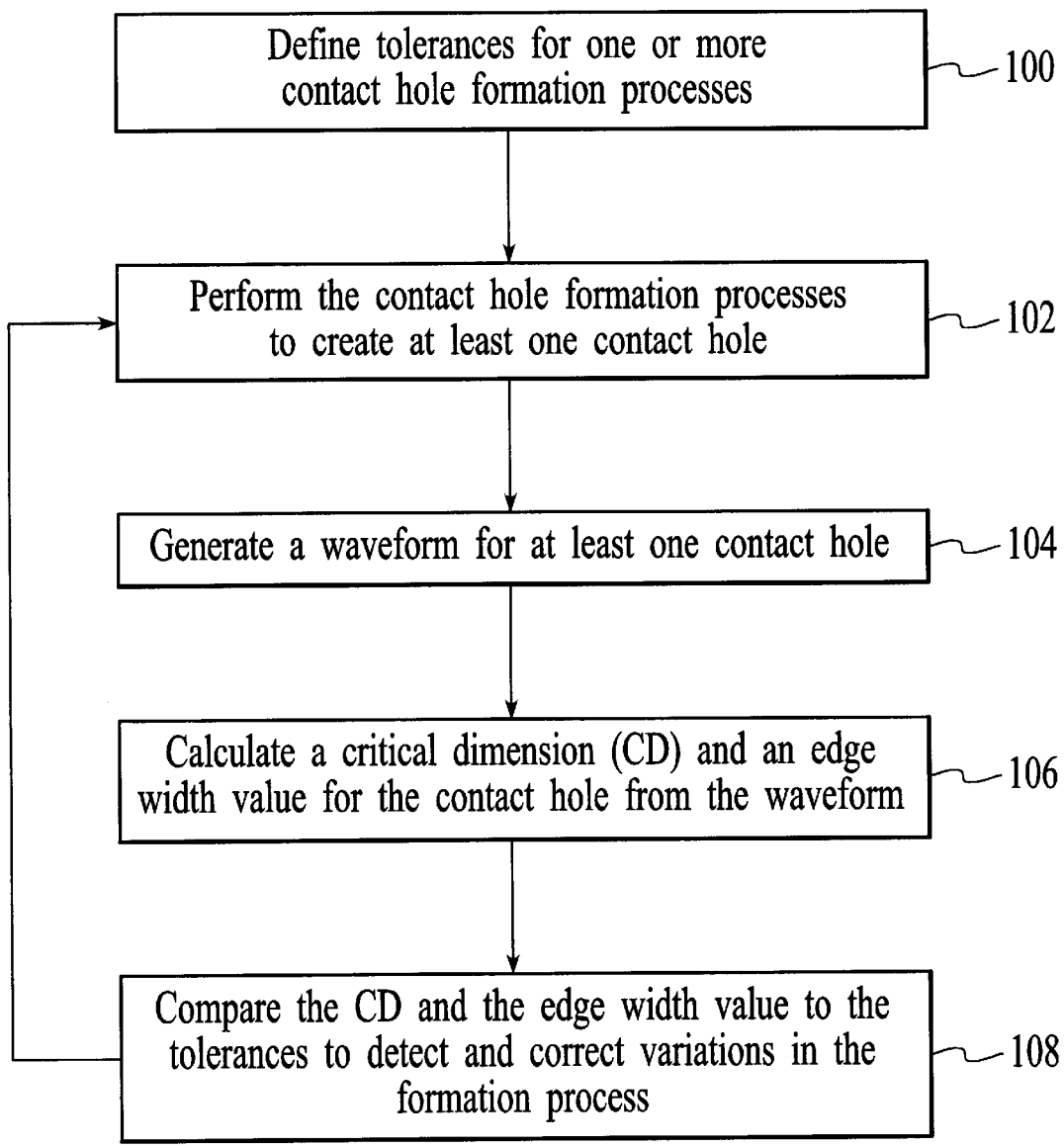
FIG. 4 is a flow chart illustrating a contact hole formation and inspection process in accordance with the present invention.

FIG. 4 is a flow chart illustrating a contact hole formation and inspection process in accordance with the present invention. The process begins by defining tolerances for one or more contact hole formation processes in step 100. This may include, for example, defining tolerances for photoresist exposure, and etching. Thereafter, contact hole formation processes are performed to create at least one contact hole in step 102. After at least one of the formation processes is performed, a waveform is generated in step 104. In a preferred embodiment, the waveform is generated from a CD-SEM tool.

A slope detection algorithm is then executed that calculates the CD and the edge values of the contact hole in step 106. The CD and the edge width value are then compared to the tolerances to detect and correct variations in the formation process in step 108, so that the next set of contact holes created by the processes will be formed correctly. According to the present invention, contact hole fabrication is simplified by eliminating the need for a manual inspection, which also reduces the cost of fabrication.

Figure 5:
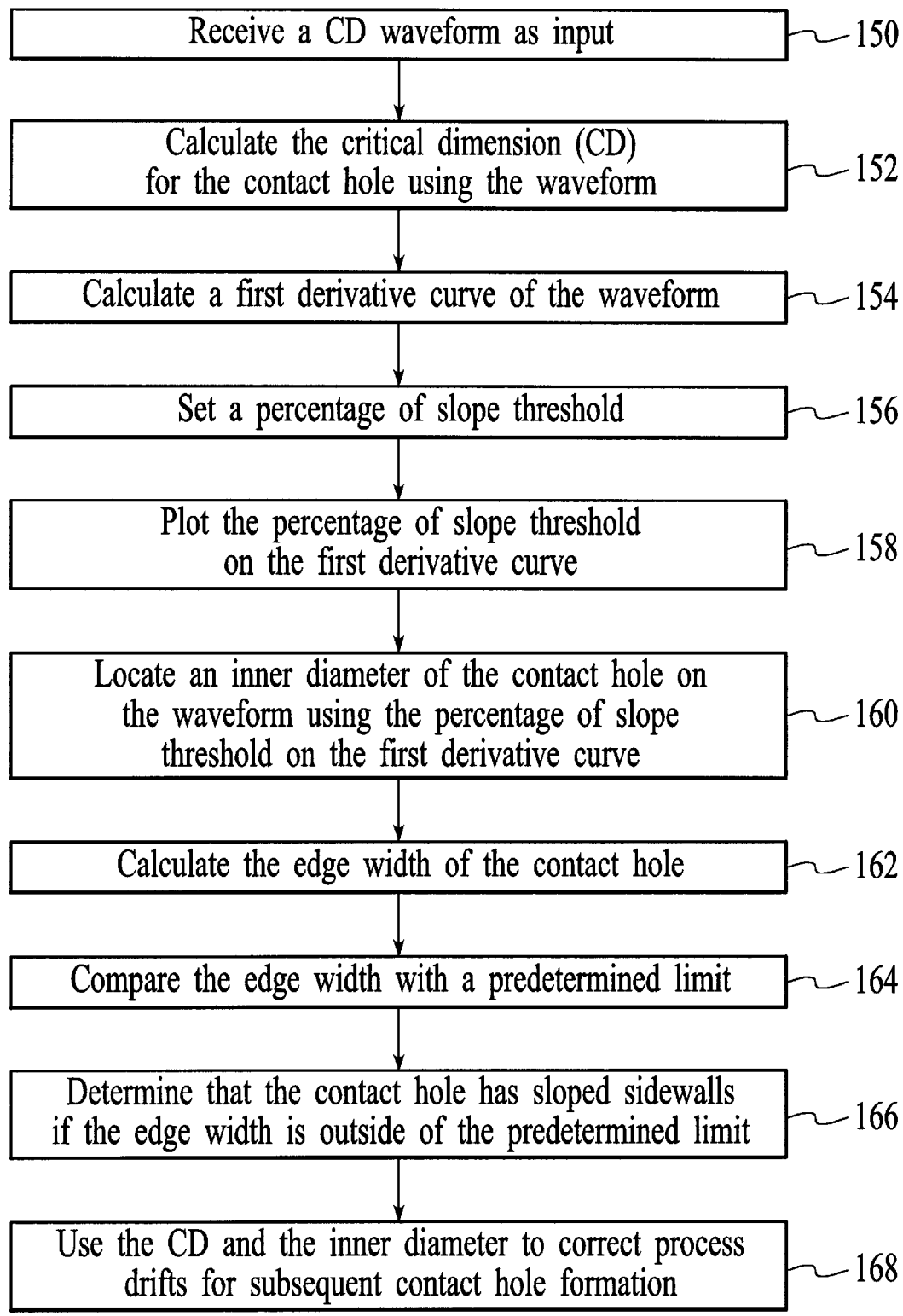
FIG. 5 is a flow chart illustrating a computer-implemented process for detecting sloped contact holes using a CD-SEM waveform in accordance with the present invention.

To more particularly describe the slope detection algorithm of the present invention, refer now to FIG. 5. FIG. 5 is a flow chart illustrating a computer-implemented process for detecting sloped contact holes using a CD waveform in accordance with the present invention. The algorithm begins by receiving a CD waveform for a contact hole as input in step 150. In a preferred embodiment, the waveform originates from a top-down CD-SEM tool. Those with ordinary skill in the art will recognize, however, that other waveforms or line traces may also be used, such as one derived from an atomic force microscope (AFM) tool.

Next, the critical dimension (CD) of the contact hole is calculated from the waveform in step 152. In a preferred embodiment, the CD is calculated by measuring the distance between the two maximum peaks on waveform. Alternatively, the CD may be measured by measuring the distance between the outer diameters on the waveform, or by a linear algorithm approximation, or by applying any of those measurement techniques to the first or second derivative of the waveform.

A first derivative of the entire waveform is then calculated in step 154, and a percentage of slope threshold is set in step 156. After the first derivative is calculated, the percentage of slope threshold level is plotted on the first derivative curve corresponding to the peak-to-valley portion of the waveform in step 158.

Figure 6:
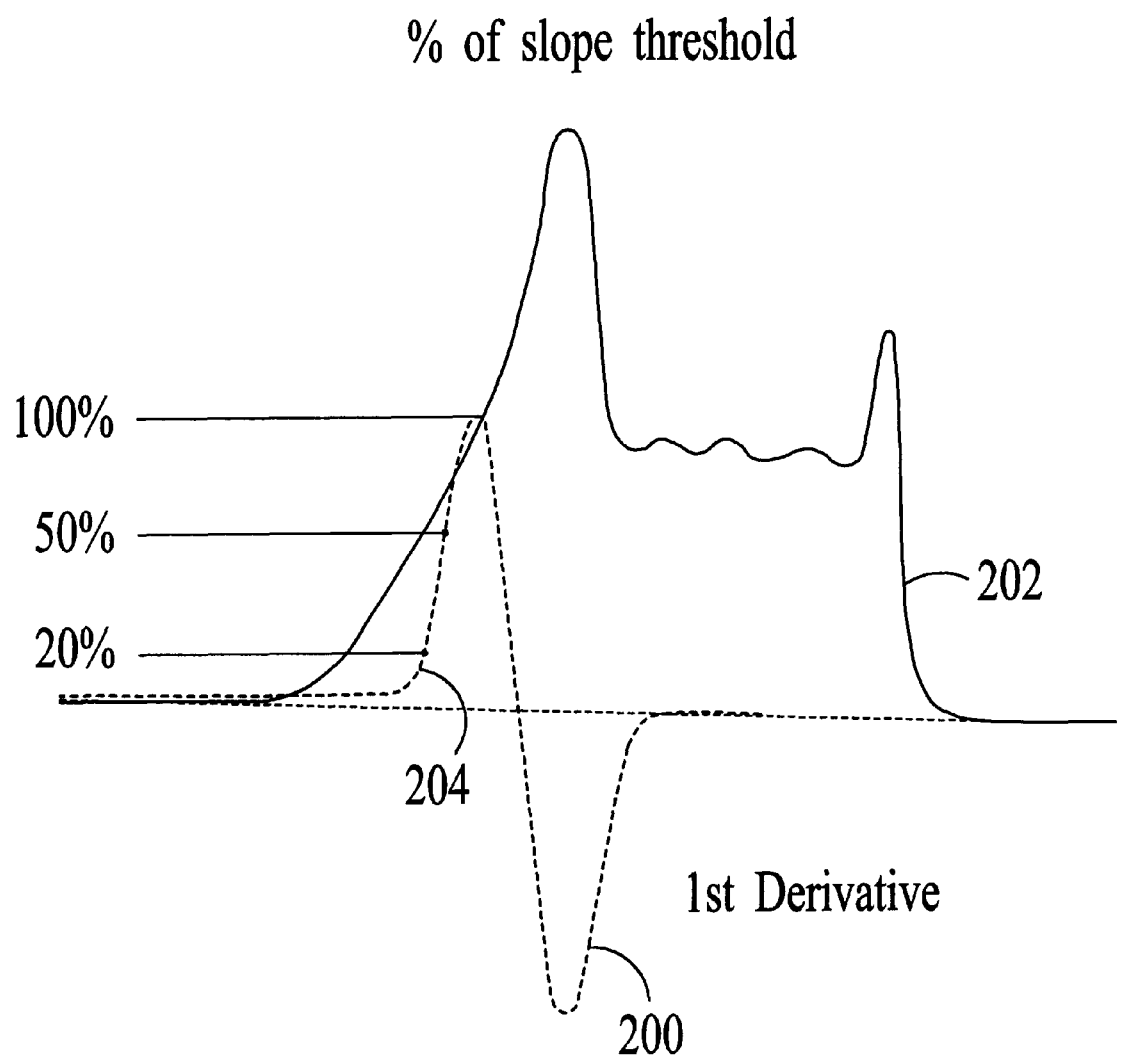
FIG. 6 is a graph showing a first derivative curve calculated for a waveform.

FIG. 6 is a graph showing a first derivative curve 200 calculated for a waveform 202. Example preset slope threshold levels 204 of 20%, 50%, and 100% are shown plotted along the first derivative curve 200.

Referring again to FIG. 5, an inner diameter of the contact hole is then located on the waveform using the percentage of slope threshold 204 on the first derivative curve in step 160. In a preferred embodiment, the location of the inner diameter is determined by plotting a point on the waveform that is vertically adjacent from the slope threshold along the first derivative curve.

Figure 7A:
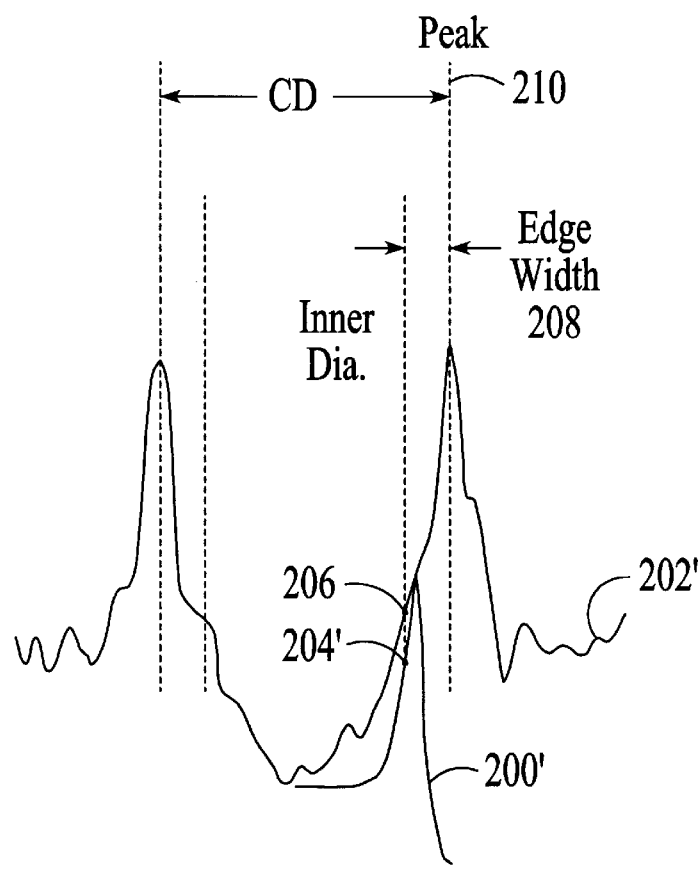
FIGS. 7A and 7B are diagram showing a waveform and a corresponding first derivative curve.

FIG. 7A is a diagram showing a waveform 202' and a corresponding first derivative curve 200'. The slope threshold 204' is shown plotted on the first derivative curve 200', and the inner diameter 206 is shown plotted on the waveform 202' at a point vertically adjacent to the slope threshold 204.

Figure 7B:
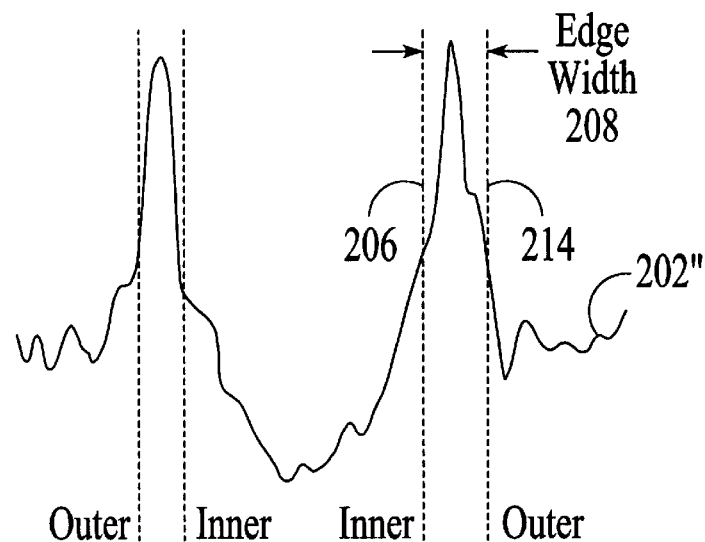

Referring to FIGS. 5 and 7A, the edge width 208 of the contact hole is then calculated in step 162. In a preferred embodiment, the edge width 208 is calculated by measuring the distance between the peak 210 and the inner diameter 206. In an alternative embodiment, the edge width 208 may be calculated by measuring the distance between the inner diameter 206 and an outer diameter 214, as shown in FIG. 7B. In a preferred embodiment, the outer diameter is determined using a maximum falling slope of the waveform 202".

It can be seen in the graphs of FIGS. 6 and 7A that setting a higher percentage of slope threshold 204 results in a wider edge width calculation, while setting a lower percentage of slope threshold 204 and a thinner edge width calculation.

After calculating the edge width 208, the edge width 208 is compared to a predetermined limit in step 164. In one preferred embodiment, the predetermined limit for the edge width 208 may range from 0.05 to 0.08 μm when measured from peak 210 to the inner diameter 206, and may range from 0.08 to 0.12 μm when measured from the outer diameter 216 to the inner diameter 206.

If the edge width 208 is outside of the predetermined limit, then it is determined that the contact hole has sloped sidewalls in step 166. Conversely, if the edge width 208 is within the predetermined limit, then it is determined that the contact hole does not have sloped sidewalls. In this case where a sloped sidewall is detected, the CD 212 and the inner diameter 208 may be used to correct process drifts for subsequent contact hole formation in step 168.

According to the present invention, the slope detection algorithm calculates two contact hole values from the CD-SEM waveform; both the CD and the edge width. By comparing the edge width with the predetermined limit, contact holes having sloped sidewalls may be automatically detected, thereby eliminating the need for manual inspection and reducing manufacturing costs.

A method for fabricating and inspecting integrated circuit contact holes has been disclosed. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for contact hole formation and inspection comprising the steps of:
   (a) defining tolerances for one or more contact hole formation processes;
   (b) performing at least one of the contact hole formation processes to create at least one contact hole;
   (c) generating a waveform for at least one contact hole;
   (d) calculating a critical dimension (CD) and an edge width value for the contact hole from the waveform; and
   (e) comparing the CD and the edge width value to the tolerances to detect and correct variations in the formation process.

2. The method of claim 1 wherein step (c) further includes the step of:
   (i) defining tolerances for a deposition exposure process and an etch process.

3. The method of claim 2 wherein step (c) further includes the step of:
   (i) generating the waveform after each process step is performed.

4. The method of claim 3 wherein step (c) further includes the step of:
   (ii) generating the waveform using a top-down microscope tool.

5. The method of claim 4 wherein step (d) further includes the step of:
   (i) comparing the edge width value to a predetermined limit to detect whether the contact hole has sloped sidewalls.

6. The method of claim 5 wherein step (d) further includes the step of:
   (ii) calculating the edge width value using a slope detection algorithm.

7. The method of claim 6 wherein step (d) further includes the step of:
   (ii) calculating the edge width value by calculating a first derivative curve for the waveform and plotting a slope threshold on the first derivative curve.

8. A computer-implemented method for detecting a sloped contact hole using a waveform generated for the contact holes comprising the steps of:
   (a) receiving the waveform as input;
   (b) calculating the critical dimension (CD) for the contact hole using the waveform;
   (c) calculating a first derivative curve of the waveform;
   (d) setting a percentage of slope threshold;
   (e) plotting the percentage of slope threshold on the first derivative curve;
   (f) locating an inner diameter of the contact hole on the waveform using the percentage of slope threshold on the first derivative curve;
   (g) calculating the edge width of the contact hole;
   (h) comparing the edge width with a predetermined limit;
   (i) determining that the contact hole has sloped sidewalls if the edge width is outside of the predetermined limit.

9. The method of claim 8 further including the step of:
   (j) determining that the contact hole does not have sloped sidewalls if the edge width is within the predetermined limit.

10. The method of claim 9 wherein step (j) further includes the step of:
    (i) using the CD and the inner diameter to correct process drifts for subsequent contact hole formation.

11. The method of claim 10 wherein step (g) further includes the step of:
    (i) calculating the edge width by measuring the distance between a peak on the waveform and the inner diameter.

* * * * *